United States Patent [19]

Moffat

[11] Patent Number: 5,171,393
[45] Date of Patent: Dec. 15, 1992

[54] WAFER PROCESSING APPARATUS

[76] Inventor: William A. Moffat, 4436 Adragna Ct., San Jose, Calif. 95136

[21] Appl. No.: 737,455

[22] Filed: Jul. 29, 1991

[51] Int. Cl.$^5$ .................. H01L 21/306; B44C 1/22
[52] U.S. Cl. .......................... 156/345; 156/639; 156/640; 156/643
[58] Field of Search .............. 156/345, 637, 639, 640, 156/643, 646; 204/298.35; 134/33, 119, 198, 199, 200

[56] References Cited

U.S. PATENT DOCUMENTS

| | | | |
|---|---|---|---|
| 4,161,356 | 7/1979 | Giffin et al. | 354/323 |
| 4,715,921 | 12/1987 | Maher et al. | 156/345 |
| 4,875,989 | 10/1989 | Davis et al. | 156/345 X |
| 4,908,095 | 3/1990 | Kagatsume et al. | 156/345 X |
| 4,971,653 | 11/1990 | Powell et al. | 156/626 |
| 4,986,877 | 1/1991 | Tachi et al. | 156/643 |
| 4,992,136 | 2/1991 | Tachi et al. | 156/643 |

Primary Examiner—William A. Powell
Attorney, Agent, or Firm—Schneck & McHugh

[57] ABSTRACT

A semiconductor wafer processing station comprising a plasma etching unit, a wet processing spin-spray unit, a robotic wafer transfer arm, and a central control computer all contained in a single housing. The apparatus is designed to perform manufacturing tasks especially related to photoresist processing: photoresist developing, descumming, baking and hardening, and stripping. The apparatus follows preprogrammed instructions which allow the station to automatically perform wafer processing routines by removing wafers from a storage cassette, then transferring the wafers to the processing unit with the robotic arm. Custom processing procedures are programmable, allowing practical small-scale low volume wafer development. Wafer processing routines envisioned include photoresist application and developing, plasma etching and descumming, and procedures involving multiple processing steps utilizing both the plasma/oven unit and the wet chemical spin-spray unit. Such routines would perform precision etching or serve to remove contaminants produced in the photoresist processing procedures.

19 Claims, 15 Drawing Sheets

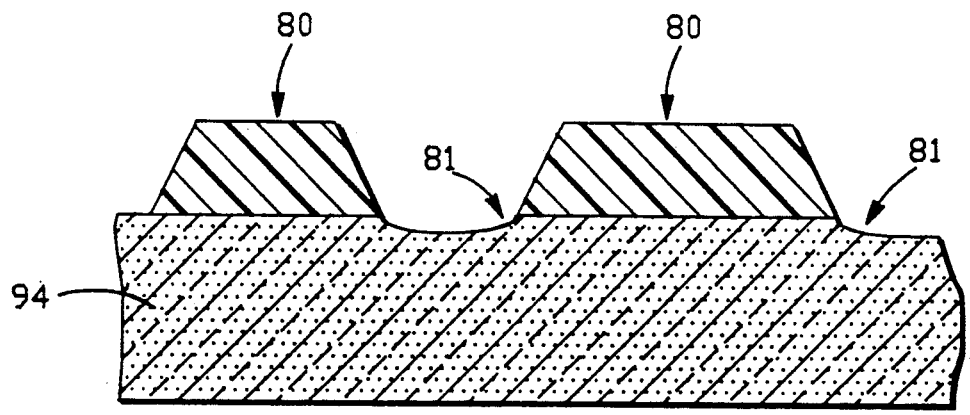
FIG.—7a
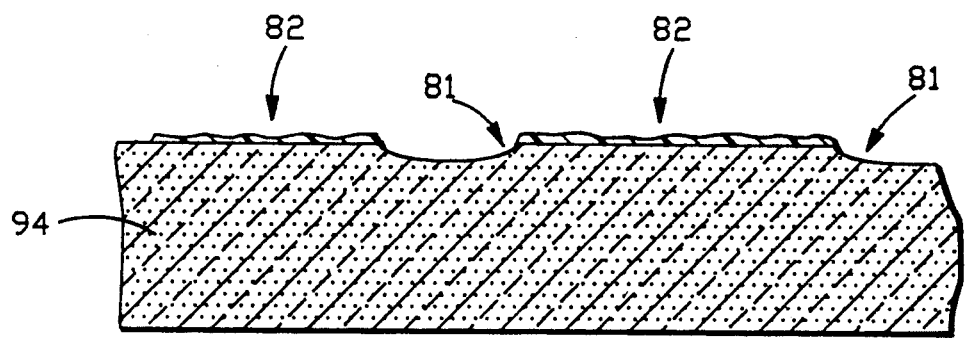
FIG.—7b
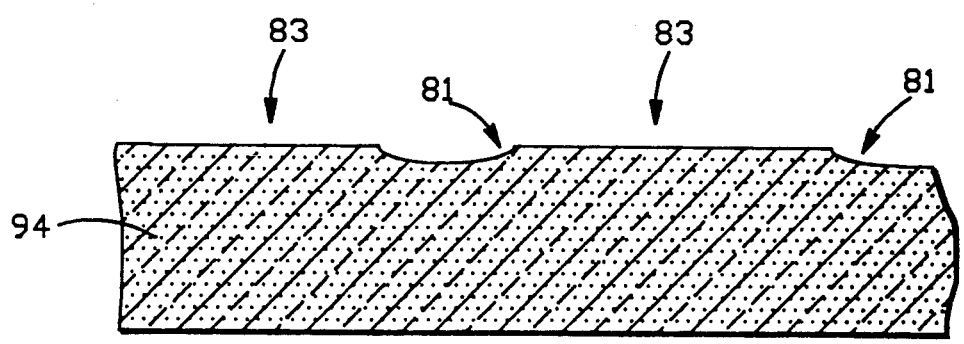
FIG.—7c

WAFER PROCESSING APPARATUS

TECHNICAL FIELD

The invention relates to wafer processing apparatus and in particular to an apparatus for carrying out processes involving photoresist in manufacturing semiconductor wafers.

BACKGROUND ART

The manufacture of semiconductor wafers involves the formation of layers, one atop another, on a semiconductive substrate. Each layer is formed as thin film having portions which are then etched away to produce surface relief patterns. These patterns constitute the electronic components of integrated circuits, and are the result of the complex manipulation of layers and impurities which are diffused into sections of the wafer. An important part of this manufacturing process involves the use of photosensitive liquid called photoresist, which is deposited evenly on the semiconductor wafer, then baked to harden the substance. Patterns are defined on the surface using a mask, exposing with ultraviolet light, then chemically developing the exposed photoresist. Industry commonly uses several types of equipment for these processes, each addressing a single step in the manufacture of silicon wafers.

The treatment of wafers coated with resist, and exposed with a circuit pattern, involves employing a resist developer; usually an ammonium hydroxide solution. This basic solution selectively removes the acidic exposed areas of the photoresist. The wafer is sprayed with water to rinse away the developer, then spun rapidly to throw off the water, drying the surface.

A piece of equipment used in subsequent steps is an oven for baking the wafers. This process hardens the developed photoresist so that it will stand up to later, more aggressive, processing steps aimed at underlying layers. These later steps might include treatment by gaseous reactive ion species, commonly referred to as plasma etching, or further processing with wet chemicals. Each of these steps is typically performed independently, in machines designed for a dedicated task.

Spin-spray processing units for photoplates and wafers are known. For example, U.S. Pat. No. 4,161,356 discloses a spin-spray processing unit primarily for photographic plates, but could easily be adapted for wafers. The etching which takes place in this patent is chemical etching. In many processing steps, plasma etching is a preferred method.

In U.S. Pat. No. 4,992,136 Tachi et al. disclose a dry etch plasma method wherein a film forming gas reacts with a surface to be etched, making possible precise etching of complex surfaces, such as the side walls of a hole.

In the past, a collection of spin-spray processors, plasma etchers, and other semiconductor manufacturing equipment occupied a considerable amount of space in wafer fabrication facilities.

An object of the invention is to devise a machine for carrying out the chief functions in the processing of semiconductor wafers within a compact space. It is also an object of the invention to meet requirements for new techniques in plasma resist stripping. These requirements involve the use of wet units to remove either the ash created by plasma processing of the wafer or to remove a thin layer of contaminated photoresist left after partial plasma stripping.

SUMMARY OF INVENTION

The objects stated above has been achieved with a machine which, in a single housing, contains both a spin-spray processing unit and a plasma etcher. Each of these further designed to provide a plurality of functions. The spin-spray processing unit may act as a developer or a washer; the plasma etching unit can serve as a photoresist stripper, a descumming unit, or a hard bake oven. A robotic arm is provided to allow automatic transfer between the spin-spray processing unit, the plasma etching unit, and a wafer supply.

The transfer robot has parallel vertical axes, allowing the tip of the robot arm a full range of motion in the X, Y plane. The principal vertical axis is held within the apparatus housing, but is afforded vertical motion in the Z direction so that wafers may be lifted as well as translated. The robot arm allows a wafer to be placed in the spin-spray unit for wet processing, then moved to the plasma etcher for etching, and back again to the spin-spray unit for rinsing. In this manner, wafer manufacturing steps may be carried out by a single, compact apparatus.

The robot arm, spin-spray apparatus, and etcher operate according to a computer program allowing the timing of each operation to be precisely controlled and changed as needed. Since the robot arm is central to the plasma etcher, spin-spray machine, and wafer supply, motions are quick and the risk of wafer contamination is thereby reduced. The duration and extent of the various steps involved in processing the wafer are set by the design criteria for the circuits being created.

BRIEF DESCRIPTION OF THE DRAWINGS

FIGS. 7($a$–$c$), 8($a$–$c$), 9($a$–$c$) and 10 are cross sectional views of a wafer showing the results of processing methods carried out with the apparatus of the present invention.

FIG. 11 shows a general flowchart for wafer processing with the present system.

FIG. 12 shows detail regarding steps followed in apparatus initialization and status verification.

FIG. 13 shows steps followed for wafer pick-up.

BEST MODE FOR CARRYING OUT THE INVENTION

Figure 1:
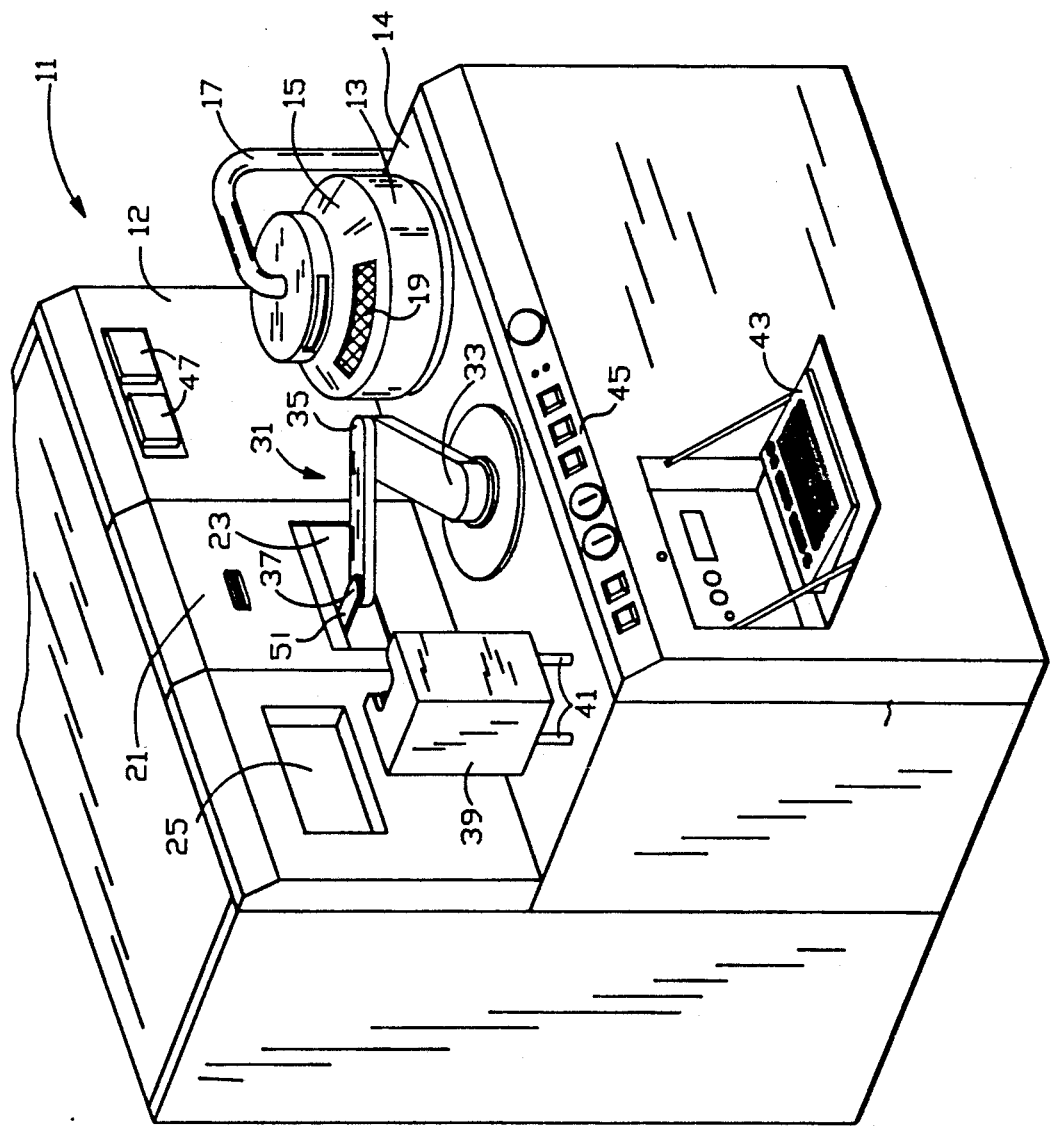
FIG. 1 is a perspective view of a machine for carrying out changeable unit processes on a semiconductor wafer.

With reference to FIG. 1, a housing 11 contains the main modules employed in the present invention. The housing includes an upright section 12 and a joined desktop section 14 having a generally planar upper surface perpendicular to the upright section. A first module, mounted in the desktop section 14, is a spin-spray processing apparatus 13 having an upper domed structure 15 and a wafer spinner chuck within, not visible in the drawing. A conduit 17 is provided to carry several pipes to the interior of the domed structure 15. These pipes allow chemicals to be sprayed on the wafer being processed. A door 19 is provided in the domed structure 15 so that a wafer may enter and leave supported by the wafer robot. The robot leaves the wafer inside the spin-spray unit until processing is complete. Within the spin-spray unit, the wafer is held on a rotating vacuum chuck which facilitates wet chemical processing steps. The internal construction of the spin-spray apparatus resembles the construction shown in U.S. Pat. No. 4,161,356, except that instead of a support for photoplates, a wafer chuck is employed.

The module occupying the upright section 12 of housing 11 is a plasma etching unit 21. Such an etcher, often referred to as a plasma stripper, has heating lamps which can be temperature controlled. A heated wafer chuck may also be used; an example of a heatable wafer chuck is shown in U.S. Pat. No. 4,971,653. A closable door 23 is provided to allow the robot access to the processing chamber and to seal the processing chamber from the atmosphere. When the wafer is inside the processing chamber, a vacuum is pulled, and pure oxygen is introduced at a relatively low pressure (approximately 150 Pa). The gas is then ionized, producing a reactive plasma. Oxygen plasma removes photoresist at a rate dependent upon the temperature and concentration of the reactive gas.

Robot arm 31 is of a vertical axis type, having vertical axes 33, 35 and 37, all parallel to each other and all extending in the Z direction. Additionally, the principal axis 33 can be translated up and down, allowing the device to raise and lower the robot arm so that wafers can be picked up from a cassette 39 which is placed on a stand 41. A commercially available robot of this type is the Gencobot by Genmark Automation of Sunnyvale, California. The robot arm 31, the plasma stripper, and spin-spray processing unit are all controlled by a programmable central computer. A processing program may be entered by means of a keyboard 43 and viewed on a monitor 25. Power and safety switches 45 and temperature and pressure monitors 47 are also provided.

The end of the robot arm is a pneumatic wand 51 which holds a wafer in place by suction. The wand and robot arm can reach into the slots of cassette 39, through the door 23 of the plasma stripper, and through the door 19 of the spin-spray apparatus. Though not necessary in the present embodiment, it is foreseen that the robot arm may also be extended to any adjoining table or piece of equipment which might be placed in proximity to housing 11; for example a light exposure unit.

Figure 2:
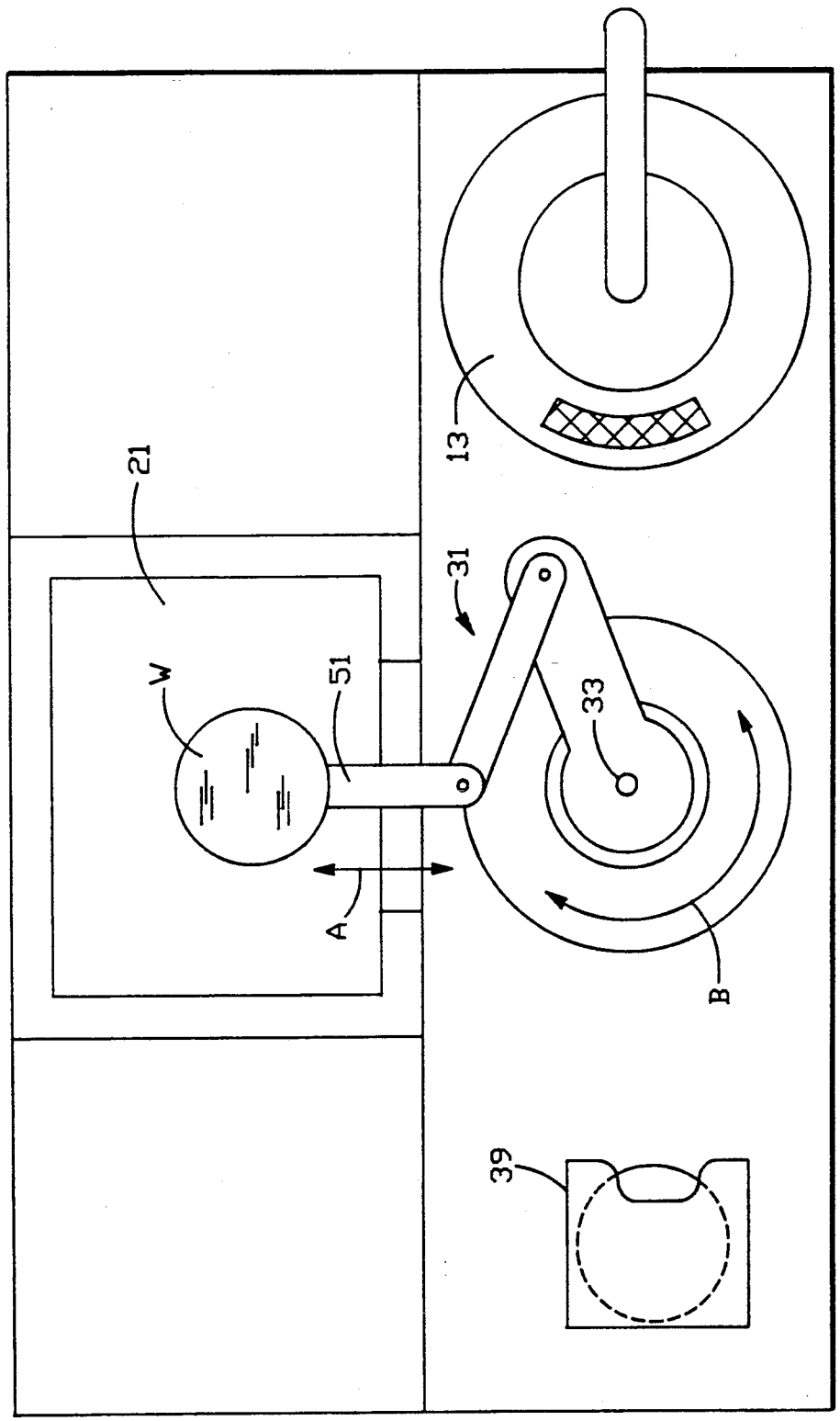
FIG. 2 is a top plan view of the apparatus of FIG. 1.

In FIG. 2, wand 51 may be seen placing a wafer, W, on a wafer chuck, not shown, within the plasma etcher 21. After placement on the wafer chuck, a slight vacuum is applied to the chuck securing the wafer, and the wand 51 may be withdrawn in the direction of arrows A. Once the wand is withdrawn, the robot arm may rotate around the principal axis 33 in the direction indicated by the arrows B. The wand 51 may pick up another wafer from cassette 39 for placement in the spin-spray unit 13 or may remain in an idle position.

Figure 3:
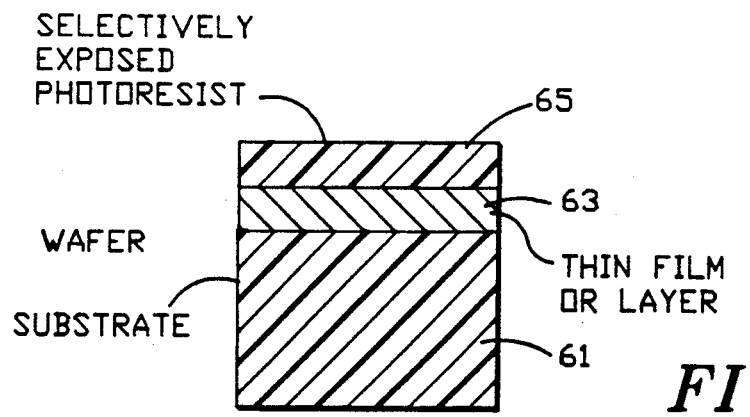
FIGS. 3–6 are cross sectional views of a wafer showing a layering process carried out with apparatus of the present invention.

The general processing steps performed by the apparatus are illustrated in FIGS. 3-6. In FIG. 3, a wafer substrate 61 is shown to have a thin layer 63 deposited thereon by another apparatus, not shown. For example, the thin film 63 may be an oxide film used to insulate the substrate from superposed layers. In order to pattern layer 63, a layer of selectively exposed photoresist 65 is placed atop the thin film layer 63. The photoresist may be spun onto the wafer using the spin-spray unit 13. In this situation, a wafer would be placed on a wafer chuck, and the wafer rotated in an appropriate speed while photoresist is sprayed onto the top of the wafer. This allows a uniform coating to be applied. The wafer is then removed from the spin-spray unit 13 by the robot arm 31, and in an apparatus not shown, a mask is placed over the photoresist so that the wafer surface may be selectively exposed to radiation. The robot arm then redeposits the wafer in the spin-spray unit 13 where developer is sprayed onto the spinning wafer. The developer removes the exposed regions of the photoresist leaving the desired pattern on the wafer surface. The wafer is then rinsed with water and spun to clean and dry the surface, completing the photoresist application process.

Figure 4:
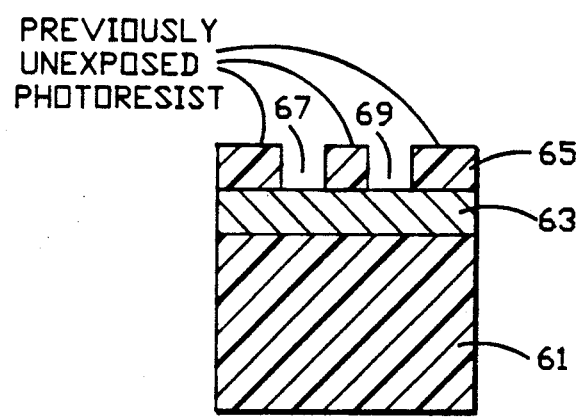
Figure 5:
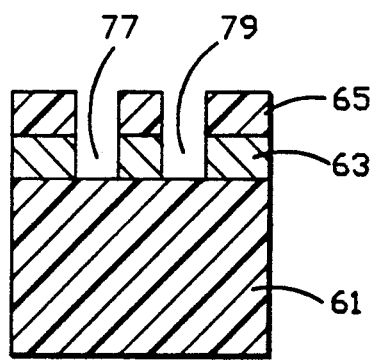
Figure 6:
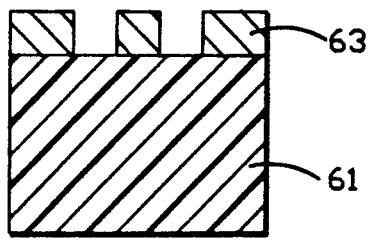

FIG. 4 shows a wafer having the photoresist removed in certain portions 67 and 69. The remaining portions of the photoresist are then hardened in the plasma chamber 21. In this instance the plasma chamber is not used to create a reactive ionized gas, but is used as a heating oven, hardening the photoresist so that it may withstand later surface treatment procedures. These hardened portions of the resist 65 remain in place, as does the thin layer 63 atop the wafer substrate 61. Once the openings 67 and 69 are created through the resist, it is possible to remove portions of the layer 63 underlying the openings 67 and 69. In order to do this, the wafer is picked up from the spin-spray unit and placed in the plasma etch unit by the robot arm. The plasma etch unit is able to selectively remove regions 77 and 79 in the thin film 63; for example, see the similar procedure described in U.S. Pat. No. 4,986,877. After etching, the robot arm removes the wafer from the plasma unit and places it back into the spin-spray processing unit 13. The total etch time may be as short as twenty seconds and the complete operation (including movement of the wafer to and from the spin-spray processing unit) can take substantially less than one minute.

Once the wafer is placed in the spin-spray unit, the wafer is rinsed to remove any ash or debris created in the etching operation. Next, any remaining photoresist is stripped with a chemical agent, such as a strong acid or base (as appropriate) so that only the patterned film layer 63 is left. This stripping step may also be performed by reactive plasma etching in the plasma chamber 21. After either type of stripping operation, the wafer is once again rinsed to remove any of the chemical etchant or ash produced in the operation. At this point, the generation of a patterned layer is complete and the wafer is ready for the next deposition of a film layer. By repeating this layering, patterning, stripping process many times, integrated circuits can be fabricated upon wafer surfaces.

Operation of the current wafer processing system involves the use of a number of basic procedures which are performed in differing sequences dependent upon the overall task required. Many of these steps are common to all of the processes performed by the station. These common steps include matters relating to system startup, wafer transportation, and completion alarms among others. Tasks, such as plasma resist stripping, photoresist developing, and rinsing and drying the wafer, are sequentially arranged in order to complete a more general wafer processing goal.

Figure 11:
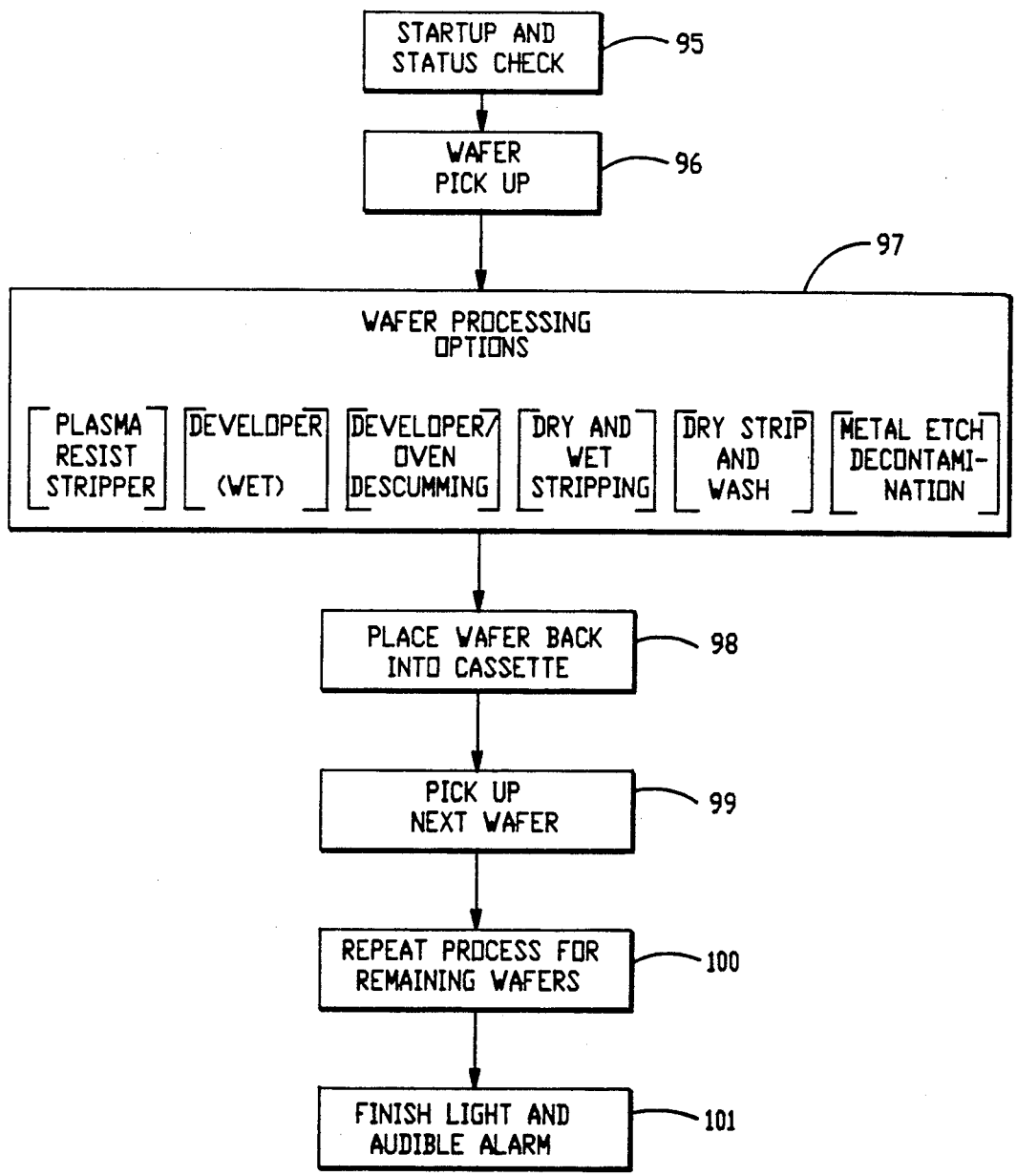
FIGS. 11–13 are flowcharts describing the steps involved in various processing routines.

As shown in FIG. 11, a general flowchart for system operation, the station follows a single operational track with the exception of the particular wafer processing task chosen. Each processing run begins with a system initialization and status check 95, the device then looks to the wafer storage cassette for the wafers to process 96, 97, 98. After completing a first wafer, the system looks back to the cassette for all subsequent wafers to be treated 99, 100. Upon completion of each cassette of wafers, the station signals the operator with a flashing light and an audible alarm 101.

Figure 12:
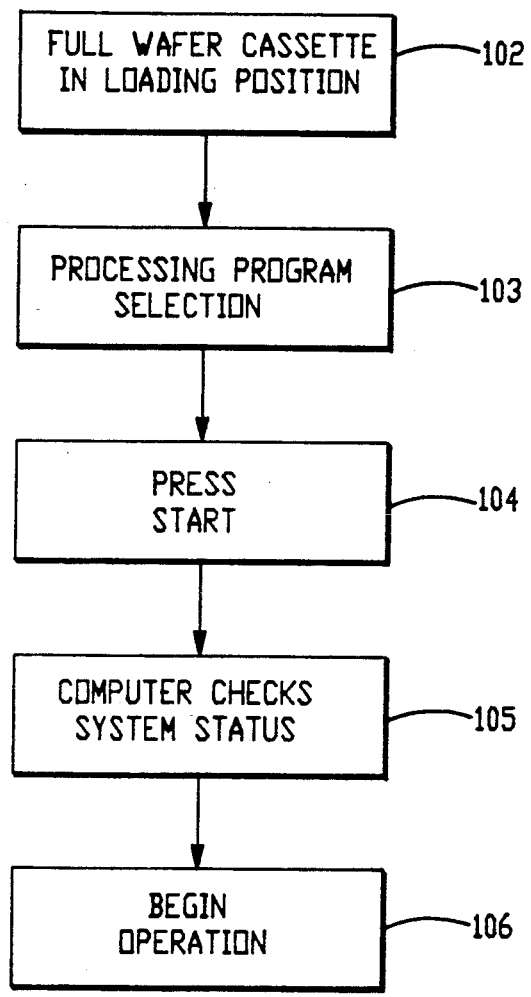

FIG. 12 examines the system initialization and status verification in further detail. Each system run begins by having the computer verify the user's instructions, and checking each of the processing units to be sure they are in condition to operate.

Beginning with a full wafer cassette 102 in loading position 41, the system waits for the operator to select a wafer processing program 103 and press start 104. The operator's selection is made from choices displayed on monitor 25. The initialization is completed by the computer performing a status check 105 of the plasma unit and the spin-spray unit, making sure there are no wafers in either unit, and that each is ready to operate. The robot arm is sent to the home position, and the processing station is prepared to begin the selected program 106.

Figure 13:
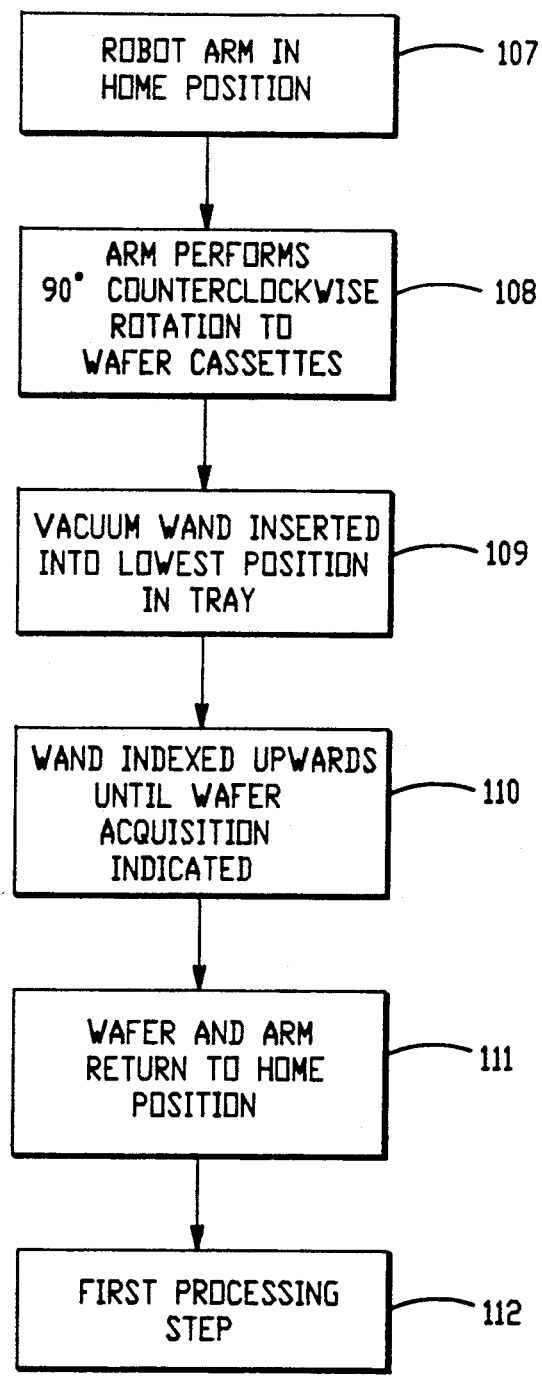

FIG. 13 lays out the manner in which the robot arm locates, picks up and returns with the first wafer. The home position 107 is located such that the vacuum wand 51 at the end of the arm 31 is centered on the station housing, pointing toward the plasma unit door. To acquire a wafer, the arm rotates 90 degrees counterclockwise, pointing the vacuum wand toward the wafer storage cassette 108. The wand is then extended into the wafer cassette at the lowest position 109, and indexed upwards until wafer acquisition is indicated 110. Securing the wafer to the wand via the vacuum pressure, the robot arm with the first wafer, returns to the home position 111. The specific wafer processing program begins 112 from this station condition, i.e. the robot arm at home with a wafer and the processing units ready to begin operation.

Specific wafer processing tasks are accomplished by moving wafers from the storage cassette to either the plasma unit or the spin-spray unit, undergoing treatment routines in the units, then return to the storage cassette. The next wafer to be processed is then retrieved and the process repeated. The treatment routines vary according to the final result desired, but generally involve one or more of the following steps: a photoresist developing step in the spin spray unit; a resist hardening procedure in the plasma chamber under heat lamps; an etching step either performed chemically with acidic or basic solutions in the wet unit or with a reactive plasma in the plasma chamber; a resist stripping operation in either unit; and finally, the wafer is washed with water then spun at high speed while being blown dry with hot nitrogen. Combinations and variations of these procedures are outlined as flowcharts in FIGS. 14-19.

Figure 14:
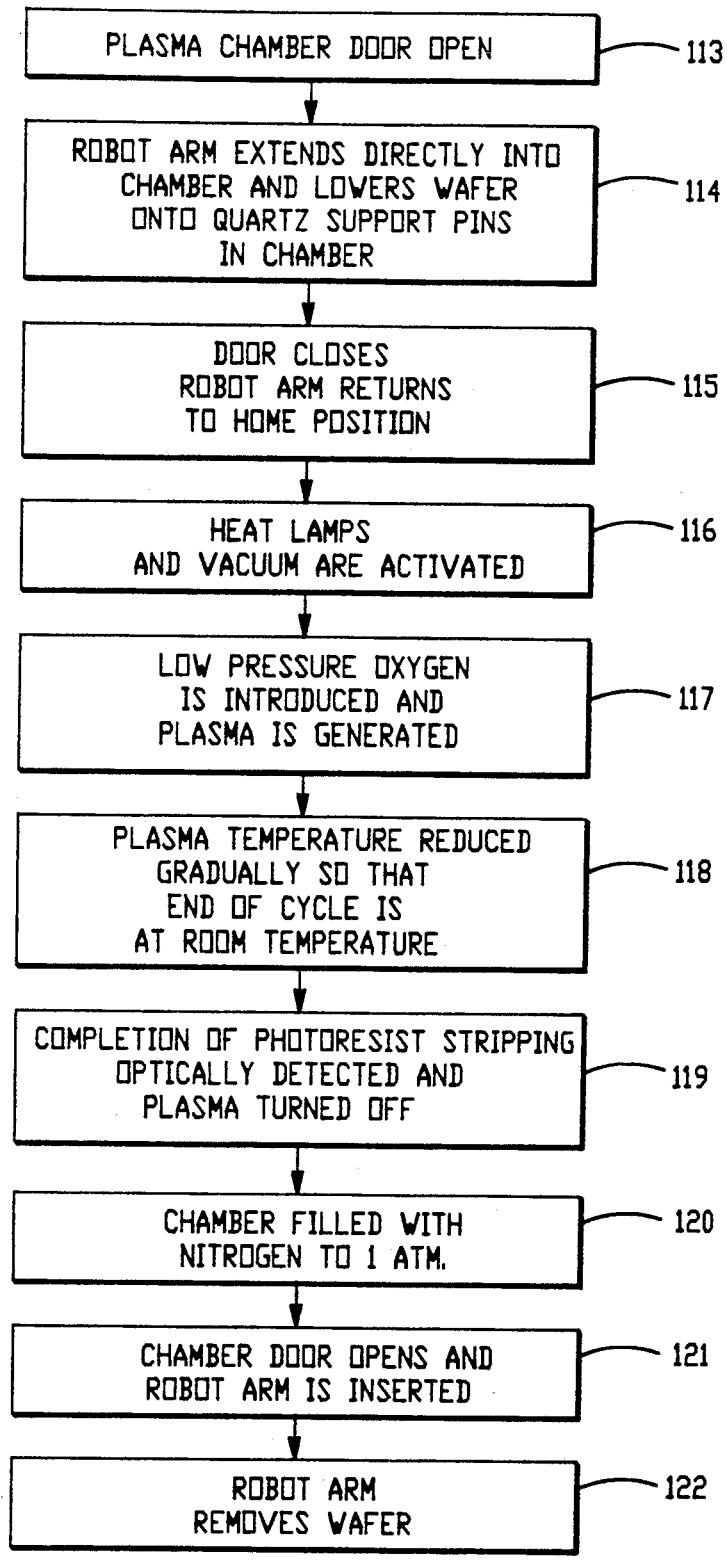
FIG. 14 shows processing steps followed during apparatus operation as a plasma resist stripper.

FIG. 14 follows the unit's operation as a plasma resist stripper. The procedure begins with the plasma unit chamber door opening 113 to allow the robot arm to deposit a wafer. From the "home" position, the robot arm with a wafer secured to the vacuum wand extends directly into the plasma unit. The arm then is indexed downwards 114 until the wafer rests upon quartz wafer support pins in the plasma unit. The door closes after the arm is withdrawn 115.

The plasma processing procedure begins when a vacuum is pulled in the plasma chamber, and the heating lamps are turned on 116. Low pressure oxygen is introduced and a plasma is formed 117. The plasma temperature is varied during the stripping process, gradually cooling to room temperature at the end of the cycle 118. The completion of the resist stripping is detected by sensors which optically monitor the resist thickness and shut off the plasma at the appropriate time 119.

Upon completion of the plasma resist stripping, the chamber fills with nitrogen to atmospheric pressure 120 and the plasma chamber door is opened 121. The wafer is then removed by the robot arm and returned to the storage cassette 122. The processing station proceeds to repeat the steps for each wafer remaining in the cassette.

Figure 15:
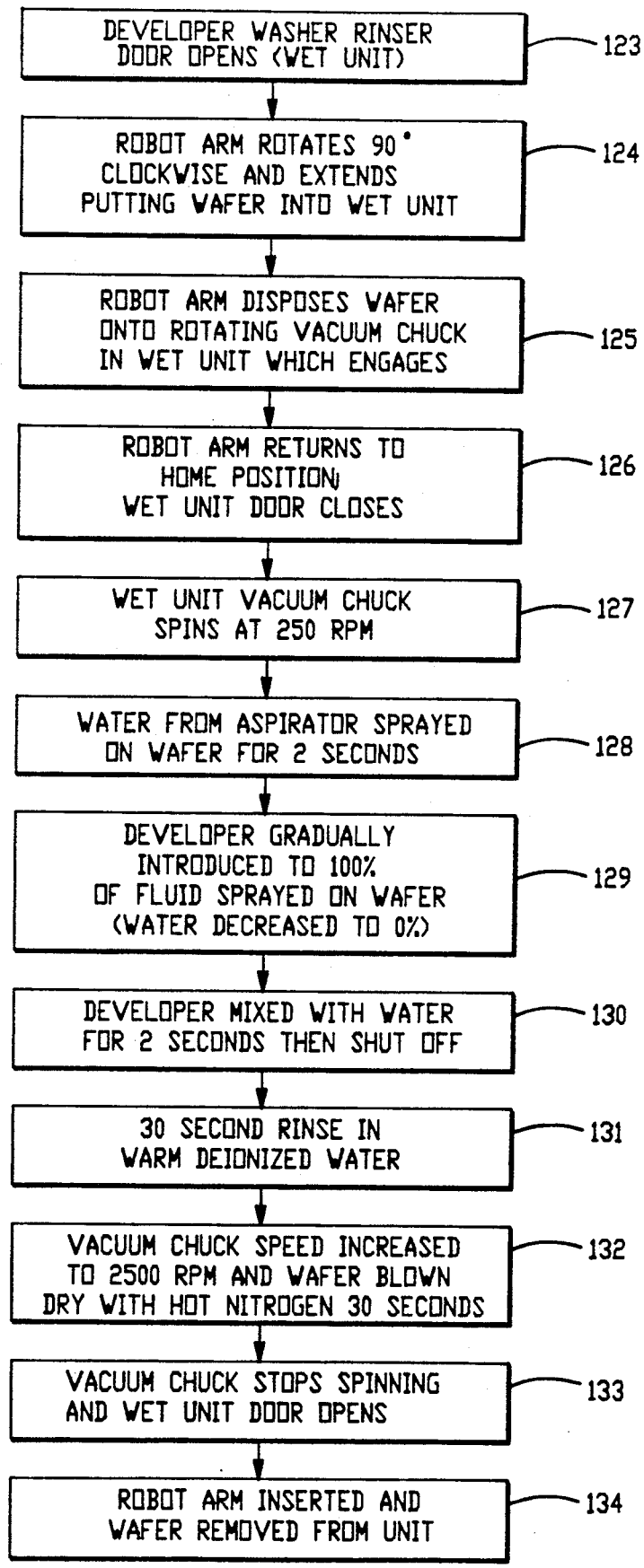
FIG. 15 shows processing steps followed during apparatus operation as a photoresist developer.

The processing station uses the spin-spray unit for wafer photoresist developing shown in FIG. 15. As with the resist stripping procedures, the process begins with the opening of the spin-spray unit door 123. The robot arm then places a wafer in the unit 124, lowering the wafer onto the vacuum chuck in the unit 125. The robot then returns to its home position and the spin-spray unit doors close 126.

With the vacuum chuck spinning at 250 rpm, 127 water is sprayed onto the wafer surface for two seconds 128. Developer solution is gradually introduced while the amount of water is reduced 129; typically 60 seconds expire before the water is off and the wafer is sprayed with 100% developer. After development for a prescribed time, the water is turned back on; and, following two seconds of mixing, the developer is turned off 130. The wafer undergoes a 30 second rinse in warm deionized water 131 before the water is turned off.

The final task is to dry the wafer. The wafer and vacuum chuck are spun at approximately 2500 rpm while being blown with hot nitrogen 132. This generally takes 30 seconds. Once dry, the wafer is removed from the spin-spray unit and placed back in the storage cassette 133, 134.

Figure 16:
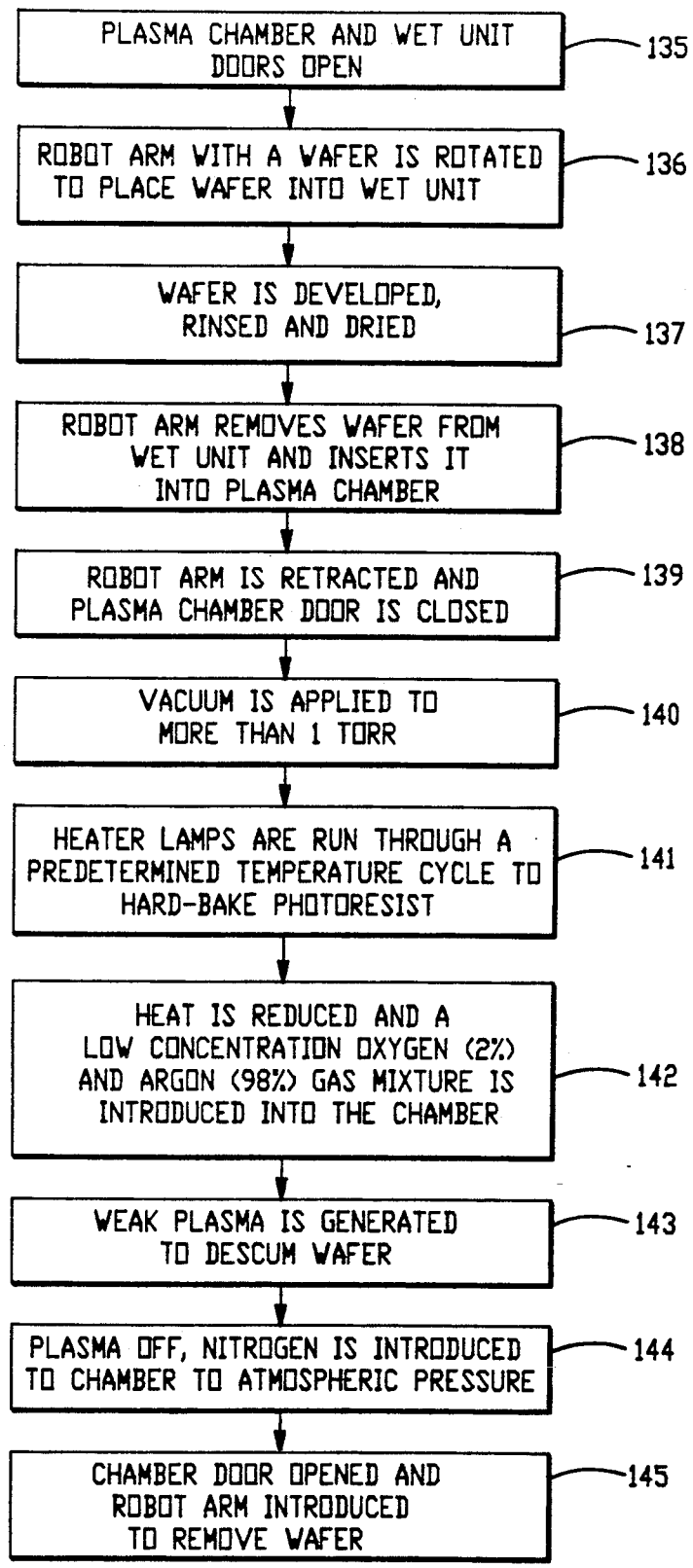
FIG. 16 shows processing steps followed during apparatus operation as a developer/oven descummer.

A third process shown in FIG. 16, which employs both the plasma unit and the spin-spray unit, is the use of the station as a developer/oven/descummer. This processing routine first develops exposed photoresist, then hardens the resist with heat, and removes resist "scum." Scum is a byproduct of the developing procedure and consists of partially developed photoresist which remains in areas cleared in the developing and rinsing steps.

The procedure begins with the robot arm and wafer in the home position and both units' doors open 135. The robot arm is rotated clockwise ninety degrees and the wafer is inserted into the spin-spray unit 136. Within the spin-spray unit, the wafer undergoes developing and rinsing as previously described 137. Following drying, the robot arm removes the wafer from the spin-spray unit, and inserts it in the plasma chamber 138.

With the plasma chamber door closed 139, the unit pulls a vacuum below 1 torr 140 and starts the heating lamps. The heating lamps are run through a predetermined temperature cycle to hard-bake the photoresist 141.

Once the baking procedure is complete, the wafer remains within the plasma chamber to be descummed. Descumming is accomplished with a gas mixture of nonreactive argon (98%) and oxygen (2%) 142. The low concentration plasma gently etches away the photoresist scum in approximately 30 seconds 143. The routine is completed by removing the wafer from the plasma unit 144, 145, placing it back in the storage cassette, and beginning work on the next wafer. Because this processing task uses both the spin-spray and the plasma chamber, wafers may be cycled into each machine as the preceding wafer leaves.

Figure 17:
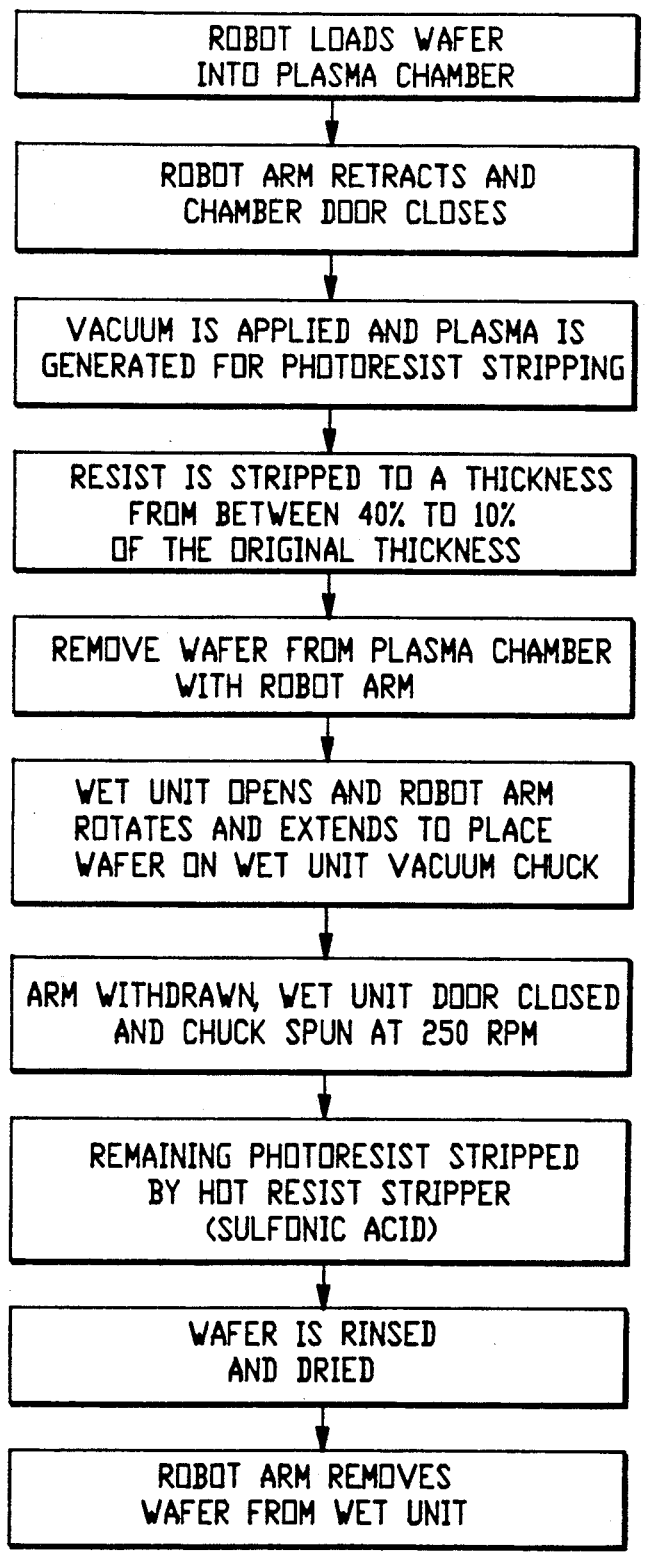
FIG. 17 shows the processing steps followed for apparatus operation as a dry and wet stripper.
Figure 18:
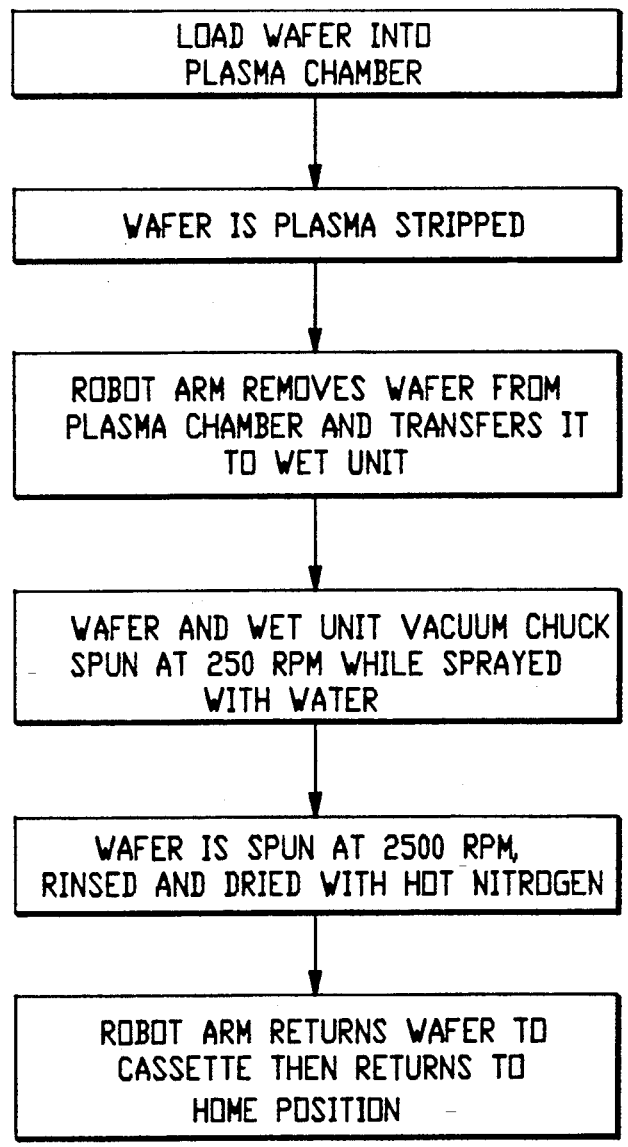
FIG. 18 shows the steps followed for apparatus operation as a combination dry strip and wash processing.
Figure 19:
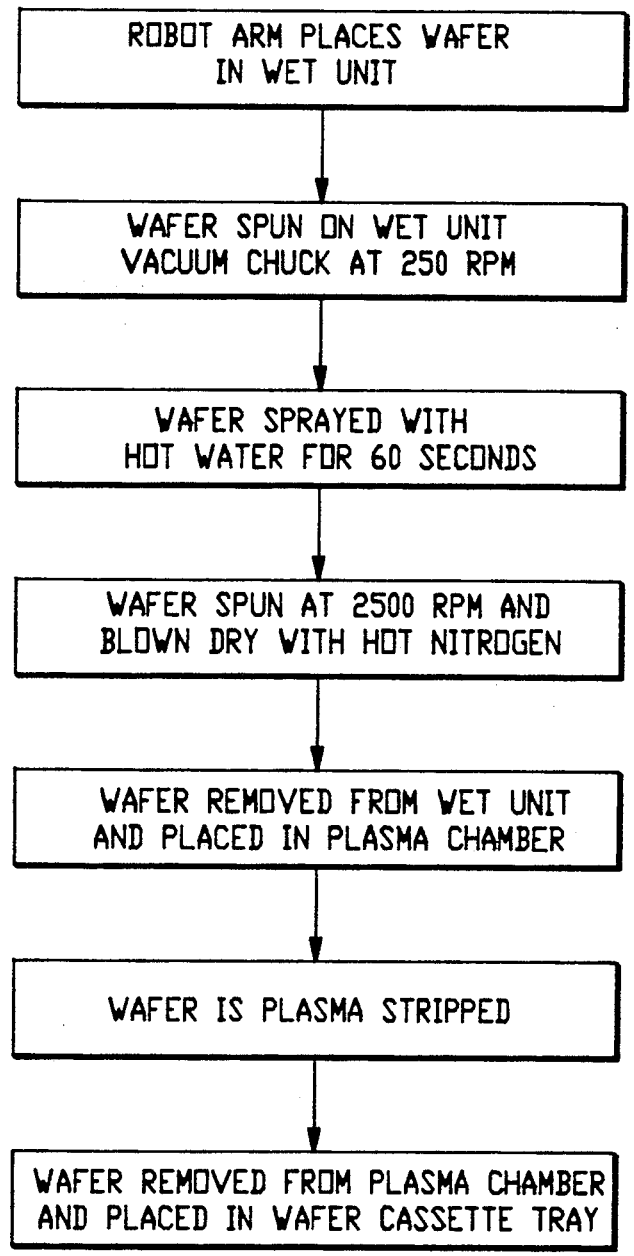
FIG. 19 follows processing steps for apparatus operation as a metal etch decontamination system.

FIGS. 17-19 are additional flowcharts outlining respectively the steps involved in wet-dry stripping, dry strip and washing, and wafer decontamination following metal etching.

The present invention is particularly suited to conduct variations of the processing steps described above. Such modified manufacturing techniques can provide dramatically improved reduction in wafer contamination due to by-products of the resist application and stripping steps. Several examples of such modified procedures are outlined below.

EXAMPLE 1

One problem common in wafer fabrication is the occurrence of contamination during the plasma stripping of photoresist. In this process, two possible sources of contamination exist: random electrons in the plasma, and sodium in the photoresist. Most commercial plasma strippers have some form of electron trap to remove the electron contamination, however sodium contamination is widely ignored. The present invention provides two methods of addressing this second contamination problem. The first method is shown in the steps diagramed in FIG. 18. FIGS. 7A, 7B and 7C show cross sections of the wafer between each step. In FIG. 7A a silicon wafer 94 with a developed photoresist pattern 80, and having etched areas 81, is placed by the robot arm into the plasma stripping unit 21 for treatment. After treatment in the plasma stripping unit, the photoresist 80 is reduced to ash 82 which has the concentrated sodium impurity in it, as is shown in FIG. 7B. Sodium diffusion from the ash of the photoresist into the silicon substrate 94 is reduced by controlling the temperature of the plasma during the stripping process cycle. A low temperature at the end of the stripping procedure will inhibit diffusion. This first contamination reduction method is completed by transferring the wafer from the plasma stripping unit to the spin-spray cleaning unit where the sodium containing ash is rinsed off, leaving clear portions of the substrate 83 surrounded by previously etched areas 81.

Figure 8A:
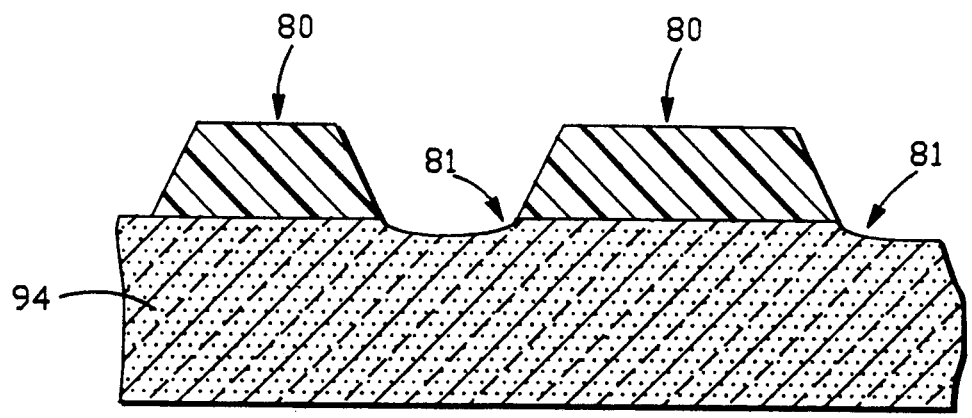
Figure 8B:
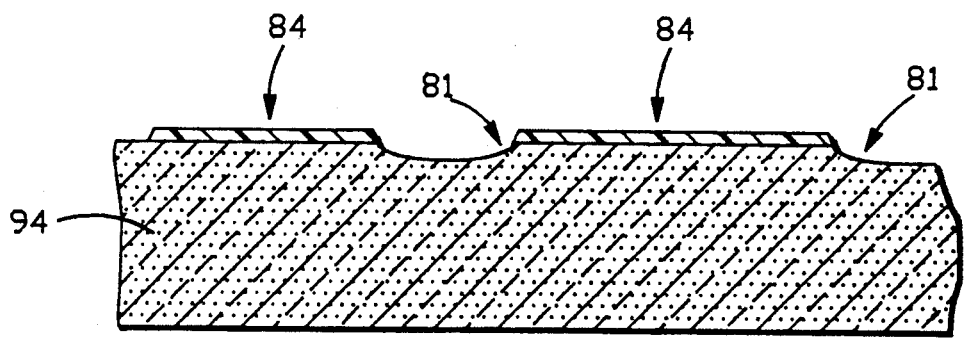
Figure 8C:
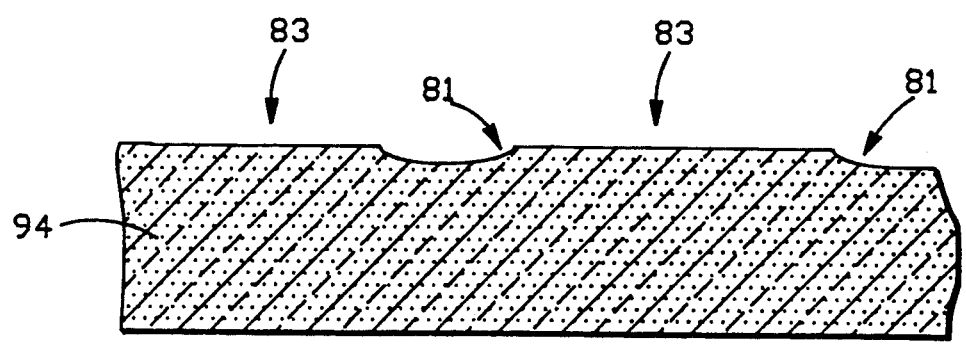

The second method for reducing sodium contamination is shown in FIGS. 8A, 8B and 8C. FIG. 17 outlines the procedure. Again a silicon wafer 94 with etched areas 81 and photoresist 80 having some sodium impurity is placed in the plasma treatment chamber 21. The photoresist is then stripped down to a thin layer 84 (approximately 10% of the original thickness) containing all the sodium impurity. The results of this processing step are shown in FIG. 8B. The robot arm then removes the wafer from the plasma stripping unit and transfers it to the spin-spray unit where a chemical stripper is used to remove the thin remaining layer of photoresist. As shown in FIG. 8C this produces a substrate 94 with patterned areas 83 and etched areas 81.

EXAMPLE 2

Figure 9A:
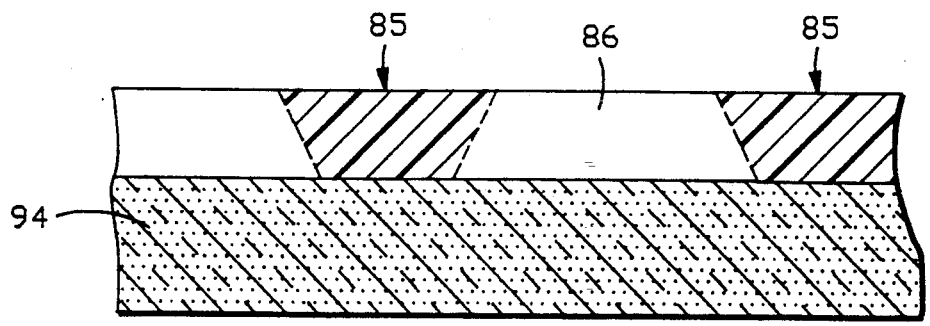
Figure 9B:
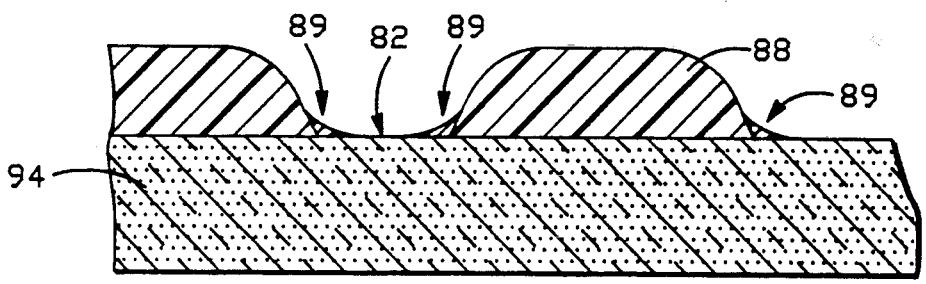
Figure 9C:
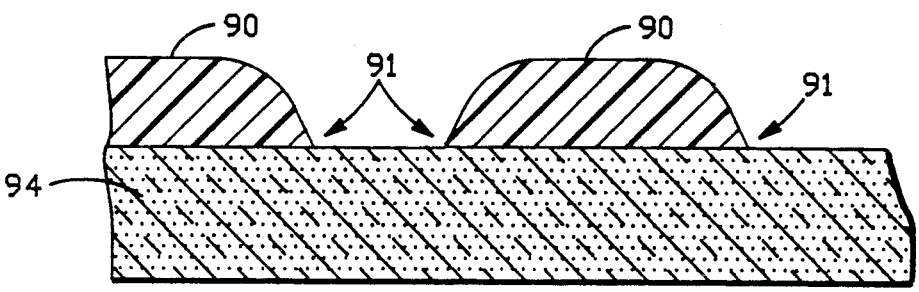

As previously described, exposed photoresist is removed from a wafer surface by a chemical developer in the spin-spray unit. Processing treatment following this step involves hardening the remaining unexposed photoresist and further insuring that photoresist is completely removed from the developed areas. The trace amounts of photoresist remaining after the developing step are referred to as photoresist scum 89. FIG. 9A shows a silicon wafer 94 having a coating of photoresist with exposed areas 85, and unexposed areas 86. It is envisioned that a wafer as shown in FIG. 9A would be presented to the present invention in a wafer cassette 39. The robot arm would transfer the wafer from the cassette to the spin-spray unit to be treated by a developer. As shown in FIG. 9B the developer removes portions of the photoresist altered by exposure 85 producing a pattern of remaining photoresist 88 surrounded by substrate 87. Also shown in FIG. 9B, the developing step is partially incomplete and leaves photoresist scum 89 in small amounts in the areas of transition from the remaining photoresist 88 and that which was removed. Following rinsing and drying, the wafer is removed from the spin-spray unit by the robot arm and transferred to the plasma treatment unit. Here the heating lamps serve to hot bake the photoresist 88. By using a low concentration oxygen plasma, the photoresist scum 89 can be removed gently. The resulting surface, shown in FIG. 9C, consists of hardened photoresist 90 having clean transition 91 to the substrate 94.

EXAMPLE 3

Figure 10:
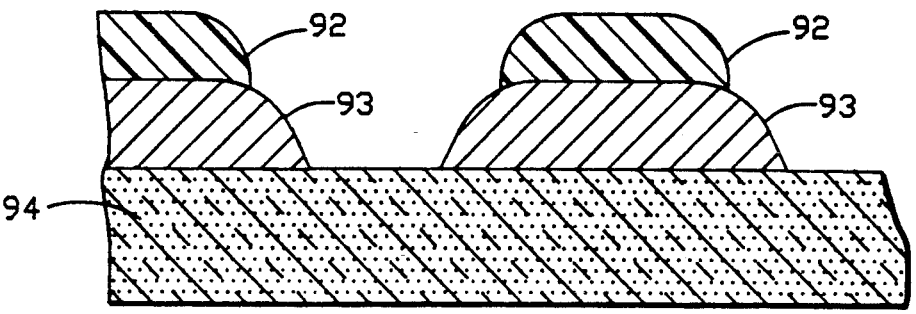

FIGS. 10 and 19 pertain to the treatment of wafers having undergone the etching of a metal layer, used, for example, for connectors. The problem commonly associated with this type of etching process is the creation of several types of contaminants. Widely practiced removal techniques involve decontamination of water soluble species in a spin-spray unit, then employing a plasma resist-stripper to remove the remaining contaminants. The present invention allows this operation to be performed automatically and quickly.

The wafer is robotically transferred from the wafer cassette 39 to the spin-spray unit 15. There it is washed with water and spun dry. The partially processed wafer is then transferred to the plasma processing unit 21, where fully concentrated oxygen plasma quickly removes the remaining contaminants and photoresist. The wafer prior to this processing is shown in FIG. 10. The etched metal 93 is shown as patterned on the wafer substrate 94 and coated with the hardened photoresist 92. The sequential processing afforded by the present invention provides a compact and efficient basis for these operations.

I claim:

1. A machine for processing individual semiconductor wafers for manufacturing integrated circuits comprising, a housing, enclosing means for transmitting vacuum pressure and a temperature control means, an evacuable plasma etcher mounted in said housing in communication with the vacuum pressure transmission means and having a front panel with a sealable door therein accessible from outside of the housing, said etcher having a wafer support means therein in communication with said temperature control means, adjusting temperature over a range of temperatures, a robot arm located partially outside of said housing, having a reach extending through said door to proximity with the wafer support, a spin-spray processing unit located partially within said housing and within the reach of the robot arm, said spin-spray processing unit having a rotating wafer support therein and having a door of a size allowing said robot arm to pass therethrough, a wafer supply means mounted to the housing within the reach of the robot arm, and a programmable controller means for commanding said robot arm to move wafers between said plasma etcher, said spin spray processing unit and said wafer supply means whereby processes for establishing layers on semiconductor wafers may be repetitively carried out within a limited space.

2. The apparatus of claim 1 wherein said housing has an upright portion and a desktop portion in an x,y plane, said desktop portion having said robot arm extending therethrough.

3. The apparatus of claim 2 wherein said robot arm has parallel axes for arm motion in said x,y plane, said arm being translatable along one of said axes for z direction motion where said z direction is perpendicular to said x,y plane.

4. The apparatus of claim 1 wherein said temperature control means for said plasma etcher can follow an exponential temperature gradient.

5. The apparatus of claim 1 wherein said spin-spray processing unit has separate means for spraying chemicals and rinse water.

6. An automated wafer processing station comprising,
   a housing;
   a plasma etching unit located in said housing having an evacuable chamber, means for holding a wafer, a sealable door, plasma generating means, chamber temperature control means and a control input;
   a spin-spray processing unit located in said housing having a wet-processing enclosure, a rotatable vacuum chuck to hold a wafer, fluid direction means for affecting fluid flow within the enclosure, a sealable door, and a control input;
   a wafer storage-cassette stand mounted on said housing for supporting a supply of wafers stored in a cassette, said cassette providing one or more wafers for processing;
   a robot arm positioned on said housing in a location allowing access to said plasma etching unit, said spin-spray processing unit, and said storage cassette stand; said robot arm having a control input, means for securing a wafer, and means for transporting said secured wafer within a volume defined by the robot arm reach;
   programmable station control means, having an input and command outputs connected to the control inputs of the robot arm, the spin-spray unit, and the plasma etching unit, for providing command information to coordinate processing procedures performed by the wafer processing station, said station control means being located within said housing.

7. The station of claim 6 wherein the housing has an upright portion and a horizontal desktop portion.

8. The station of claim 6 wherein said chamber temperature control means is a heatable wafer chuck.

9. The station of claim 6 wherein said chamber temperature control means is an array of heating lamps.

10. The station of claim 6 wherein the robot arm has mobility in three dimensions.

11. The station of claim 6 wherein the station control means provides instructional code command output signals for the repetitive execution of sequential processing operations for a plurality of wafers.

12. The station of claim 6 wherein said fluid direction means comprises a plurality of nozzles for spraying wet chemicals and gases onto a wafer surface.

13. The station of claim 6 wherein said robot arm is mounted partially within said housing.

14. The station of claim 7 wherein the programmable station control means comprises a computer located within said housing and having an operator input keyboard, an output display monitor, located on the upright portion of said housing, and a command output connected to the control inputs of the plasma etch unit, the spin-spray unit, and the robot arm.

15. An apparatus for automatically performing processing procedures on semiconductor wafers used in the manufacture of integrated circuits comprising,
   a housing, enclosing fluid control means and means for producing a vacuum;
   a wafer storage-cassette stand mounted on said housing for supporting a supply of wafers stored in a cassette, said storage-cassette providing one or more wafers for processing;
   a robot arm located on said housing so as to allow said robot arm access to wafers in said storage-cassette, said robot arm having a control interface, means for securing a wafer, and transport means for positioning said wafer in locations within the volume circumscribed by robot arm reach;
   a plasma etching unit positioned on said housing and within robot arm reach, said plasma etching unit having an evacuable chamber with a door capable of an airtight seal, a wafer holding device for maintaining a wafer's position within the chamber, heating means within the chamber for affecting the temperature within the chamber, means for controlling the gaseous contents of the chamber, plasma generating means, and a control interface;
   a spin-spray processing unit positioned on said housing and within robot arm reach, said spin-spray unit having a wet-processing enclosure, a rotatable vacuum chuck within said wet-processing enclosure, a fluid delivery means for transporting one or more fluids to said wet-processing enclosure, fluid directing nozzles to control dispersion of said fluids within said wet-processing enclosure, fluid removing means for draining fluids from said wet-processing enclosure, means for directing gases within said wet-processing enclosure, a control interface;
   programmable control means located in said housing and being connected to the control interface of said robot arm, said spin-spray processing unit, and said plasma etching unit for monitoring and commanding the coordinated operation of the robot arm, the spin-spray processing unit and the plasma etching unit, said control means having an operator instruction input and display means for providing operator information.

16. The apparatus of claim 15 wherein said housing has an upright section and a desktop section.

17. The apparatus of claim 16 wherein said robot arm and said spin-spray processing unit are mounted on the desktop section of said housing, and the plasma etching unit is located within the upright section of said housing.

18. The apparatus of claim 15 wherein the fluid delivery means and fluid directing nozzles are capable of handling reactive chemical solutions, water, and gases.

19. The apparatus of claim 15 wherein the operator instruction input is a keyboard and the display means is a monitor.

* * * * *